US007016161B2

(12) United States Patent
Hayakawa

(10) Patent No.: US 7,016,161 B2
(45) Date of Patent: Mar. 21, 2006

(54) MAGNETIC HEAD, MAGNETIC HEAD GIMBAL ASSEMBLY, MAGNETIC RECORDING AND REPRODUCING APPARATUS, AND MAGNETIC MEMORY

(75) Inventor: Jun Hayakawa, Sendai (JP)

(73) Assignee: Hitachi Global Storage Technologies Japan, Ltd., Kanagawa-ken (JP)

( * ) Notice: Subject to any disclaimer, the term of this patent is extended or adjusted under 35 U.S.C. 154(b) by 93 days.

(21) Appl. No.: 10/372,790

(22) Filed: Feb. 26, 2003

(65) Prior Publication Data

US 2003/0179510 A1 Sep. 25, 2003

(30) Foreign Application Priority Data

Mar. 25, 2002 (JP) ............................ 2002-083869

(51) Int. Cl.
*G11B 5/39* (2006.01)

(52) U.S. Cl. ...................................................... 360/322

(58) Field of Classification Search ................ 360/322; 365/158, 171

See application file for complete search history.

(56) References Cited

U.S. PATENT DOCUMENTS 6,438,026 B1 * 8/2002 Gillies et al. ............... 365/158

FOREIGN PATENT DOCUMENTS

| | | |
|---|---|---|
| JP | 4-358310 | 11/1991 |
| JP | 10-4227 | 3/1997 |
| JP | 2001-202604 | 1/2000 |

* cited by examiner

*Primary Examiner*—A. J. Heinz
(74) *Attorney, Agent, or Firm*—Reed Smith LLP; Stanley P. Fisher, Esq.; Juan Carlos A. Marquez, Esq.

(57) ABSTRACT

A magnetic head is provided with a giant magnetoresistive element, barrier layer, and highly polarized spin injection layer, The barrier layer is inserted between the giant magnetoresistive element and the injection layer. By applying a sensing current to both the magnetoresistive element and the injection layer, an output of the magnetic head can be multiplied significnantly. The output of the head is increased by increasing a resistance change rate of a magnetoresistive element used as a reading element. The increasing of the resistane change rate is due to that a band of s electrons in the Cu film grown in the highly polarized spin injection layer is placed in a highly polarized state near the Fermi level and the upward spin current only flows into the giant magnetoresistive element, which has multiplied the output.

17 Claims, 17 Drawing Sheets

MAGNETIC HEAD, MAGNETIC HEAD GIMBAL ASSEMBLY, MAGNETIC RECORDING AND REPRODUCING APPARATUS, AND MAGNETIC MEMORY

BACKGROUND OF THE INVENTION

1. Field of the Invention

The present invention relates to magnetic heads, magnetic head gimbal assemblies, and magnetic recording and reproducing apparatus, in which a three terminal magnetoresistive element or the like is used, and magnetic memory devices which are used for magnetic recording/reproducing switching devices.

2. Description of the Related Art

For use as reading elements of magnetic heads which are used in high-density magnetic recording and reproducing apparatus or recording elements of magnetic memory devices, Current in Plane, Giant Magnetoresistance (CIP-GMR) elements which allow current to flow in plane across layers and tunneling magnetoresistive elements have been proposed. The former magnetoresistive elements are described in Japanese Unexamined Patent Publication No. Hei 4-358310 and the latter magnetoresistive elements are described in Japanese Unexamined Patent Publication No. Hei 10-4227.

These previous magnetoresistive elements have limitations in increasing magnetoresistivity. In order to enhance such elements so that they make higher outputs, it is necessary to increase their magnetoresisivity by adding new material or function. In terms of material, to increase the magnetoresistive element output is achieved by application of highly spin-polarized materials typified by half metal ferromagnetic material In Japanese Unexamined Patent Publication No. 2001-202604, the following approach is described. The magnetoresistance of a tunneling magnetoresistive element is increased by providing a highly polarized spin injection layer adjacent to a magnetoresistive element of a ferromagnetic tunneling type and injecting highly spin-polarized electrons into the magnetoresistive element. However, the above Publication 2001-202604 as an example of disclosed art to which the invention pertains did not disclose an adequate magnetoresistive structure including terminals, electrodes, and power supply elements which are essential components around a reading element for a magnetic head or magnetic head gimbal assembly and magnetic recording and reproducing apparatus and disclosed nothing about increasing giant magnetoresistance. Moreover, the above approach involves a problem of noise that cannot be reduced sufficiently if the resistance of the magnetoresistive element is on the same level as the previous similar elements.

To reverse the magnetization direction in a recording layer of a magnetoresistive element in previous magnetic memory devices, the use of a magnetic field produced by the current flowing through a bit line and a word line has been proposed. However, the following problems with this method have been presented: complex wiring is a bottleneck in high-density integration and applying a magnetic field to a locally targeted cell is difficult.

SUMMARY OF THE INVENTION

Direct application of a highly spin-polarized material to a magnetic sensor part of a magnetoresistive element for the purpose of greatly increasing the output of the magnetoresistive element, as described above, is not suitable for using the element in a magnetic head structure because of a very high resistance of the element, which is on the order of megaohms and results in noise.

In the above-mentioned approach disclosed in Publication 2001-202604, the tunneling magnetoresistance is increased by providing a highly polarized spin injection layer adjacent to a magnetoresistive element of a ferromagnetic tunneling type and injecting highly spin-polarized electrons into the magnetoresistive element. However, this document did not disclose an adequate magnetoresistive structure including terminals, electrodes, and power supply elements which are essential components around a reading element for a magnetic head or magnetic head gimbal assembly and magnetic recording and reproducing apparatus and disclosed nothing about increasing giant magnetoresistance.

It is a first object of the present invention to provide a magnetic head or a magnetic head gimbal assembly and a magnetic recording and reproducing apparatus using a three terminal magnetoresistive element or the like, in which a conventional magnetoresistive element is used as a sensor and provided with an additional function, thereby enabling drastic increase of only the output of the element and without increasing noise. Particularly, the invention is to provide a proper magnetoresistive structure including terminals, electrodes, and power supply elements which are essential components around a reading element and provide a magnetic head or a magnetic head gimbal assembly and a magnetic recording and reproducing apparatus using a reading element with increased giant magnetoresistance.

It is a second object of the present invention to provide magnetic memory devices which are used for magnetic recording/reproducing switching devices using a three terminal magnetoresistive element or the like and which can be dense integrated with ease.

In accordance with the present invention and in order to achieve the foregoing objects, a magnetic head is provided which comprises a magnetoresistive element, a current generating means for generating spin-polarized current by bias voltage application, a first terminal for applying a bias voltage to the current generating means, a second terminal for detecting voltage of the magnetoresistive element, and a third terminal which is used for both the bias voltage application and the magnetoresistive layer voltage detection.

Also, a magnetic head is provided which comprises a highly polarized spin injection layer, a magnetoresistive layer, a barrier layer inserted between the highly polarized spin injection layer and the magnetoresistive layer, a first terminal layer formed on at least one end of the highly polarized spin injection layer, a second terminal layer formed on at least one end of the magnetoresistive layer, and a third terminal layer formed on the magnetoresistive layer surface opposite to its other surface contacting the barrier layer.

In the foregoing magnetic head, a giant magnetoresistive layer is used as the magnetoresistive layer. The magnetic head further comprises a first specular layer inserted between the magnetoresistive layer and the barrier layer and a second specular layer inserted between the magnetoresistive layer and the third terminal layer.

The first and second specular layers are made of at least any oxide out of Ni, Co, Fe, Ru, and Ta.

The highly polarized spin injection layer consists of a laminate of ferromagnetic and non-magnetic layers. Alternatively, the material of a laminate which is used for the highly polarized spin injection layer includes at least one of the following: Co, Fe, Ni, Mn, Al, Ti, Cu, Au, Ag, Pt, Pd, Ru, Ir, and Cr.

The magnetic head further comprises a spin filter layer inserted between the magnetoresistive layer and the barrier layer and the spin filter layer is made of any of the following: Cu, Ag, and At.

The magnetic head is mounted on a slider and the slider is mounted on a gimbal which is supported by a suspension, and the thus constructed magnetic head gimbal assembly is installed in a magnetic recording and reproducing apparatus.

Also, a magnetic memory is provided which comprises bit lines, word lines, and memory cells arranged such that each memory cell is installed at the intersections of the bit lines and the word lines. Each memory cell comprises a magnetoresistive layer and a highly polarized spin injection layer. Each memory cell further comprises an insulation layer inserted between the magnetoresistive layer and the highly polarized spin injection layer. The magnetic memory further comprises terminals for applying a bias to the highly polarized spin injection layer of each memory cell and wiring for connecting the memory cells to the terminals.

Furthermore, in the magnetic memory, the magnetoresistive layer comprises a free layer, a pinned layer, an insulation layer formed between the free layer and the pinned layer, and a terminal for current provided on an end of the free layer or pinned layer.

DESCRIPTION OF THE PREFERRED EMBODIMENTS

As an example of embodiment of the present invention, a magnetic head structure is first outlined below. The point of the present invention is to significantly multiply the output of a reading element of the magnetic head. The output is increased by increasing the resistance change rate of a magnetoresistive element used as the reading element. A magnetic sensor constituted by a magnetoresistive element of the present invention will be outlined. The magnetic head of the present invention essentially comprises a magnetoresistive layer as the reading element and a highly polarized spin injection layer as current generating means which generates spin-polarized current by bias voltage application on one end of the magnetoresistive layer, thus injecting the spin-polarized current into the magnetoresistive layer. Furthermore, the magnetic head includes a first terminal for applying the bias voltage to the highly polarized spin injection layer, a second terminal for detecting the voltage of the magnetoresistive layer, and a third terminal which is used for both the bias voltage application and the magnetoresistive layer voltage detection. In an alternative terminal arrangement, the magnetic head includes a pair of first terminals and a pair of second terminals and dispenses with the third terminal.

The highly polarized spin injection layer and the magnetoresistive layer were installed and a barrier layer was inserted between the highly polarized spin injection layer and the magnetoresistive layer. On at least one end of the highly polarized spin injection layer, the first terminal layer was formed. On at least one end of the magnetoresistive layer, the second terminal layer was formed. On the magnetoresistive layer surface opposite to its other surface contacting the barrier layer, the third terminal layer was formed.

Further detailed embodiments of the present invention will be recited below. In the following, first, embodiments of magnetoresistive structures for increasing the resistance change rate of the magnetoresistive layer will be described, and then, embodiments of magnetic heads, magnetic head gimbal assemblies, magnetic recording and reproducing apparatus, and magnetic memory devices using any of the above magnetoresistive structures will be described.

[Embodiment 1]

Figure 1:
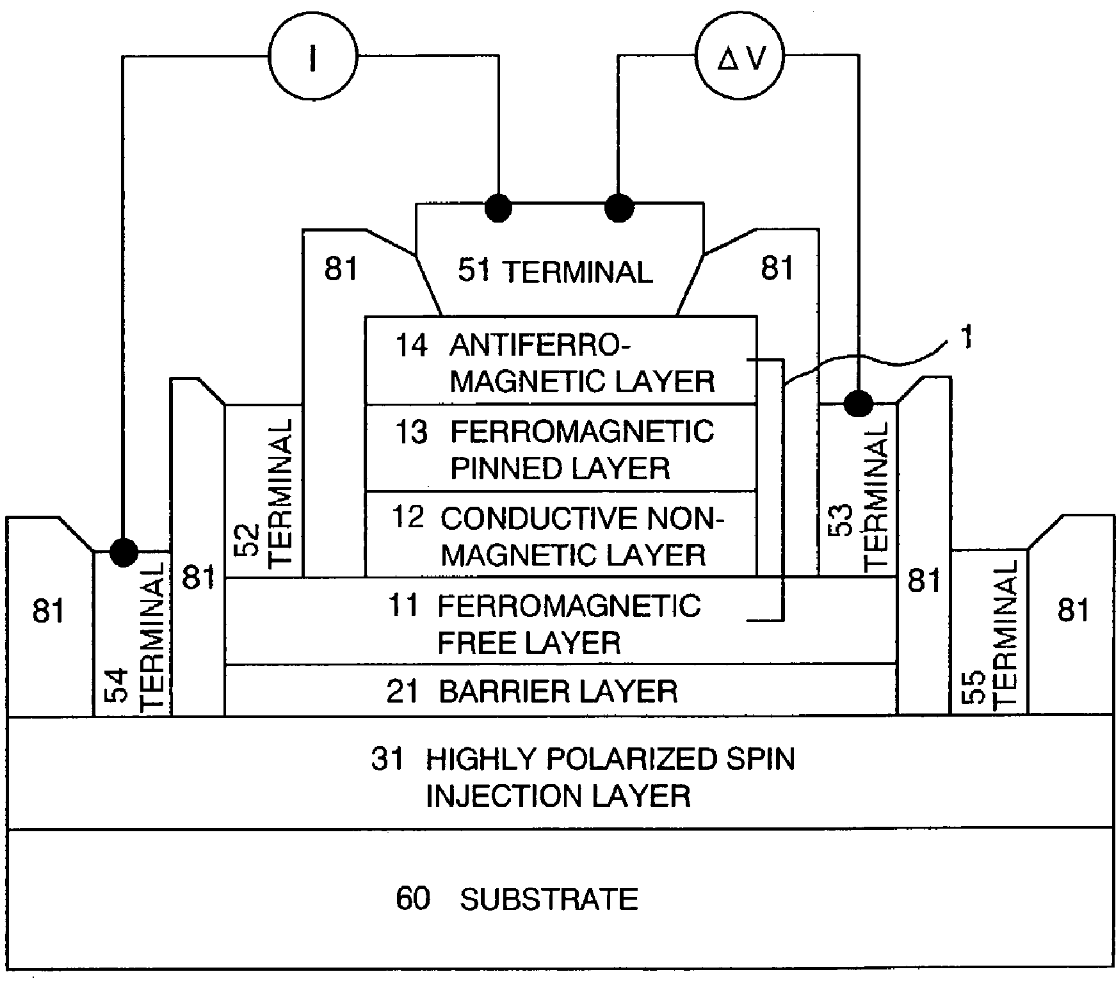
FIG. 1 is a simplified structural diagram showing a first structure example of a three terminal magnetoresistive element integral with a highly polarized spin injection layer of the present invention.

A preferred Embodiment 1 of the invention is shown in FIG. 1.

A highly polarized spin injection layer 31 is formed on a substratum 60 and a giant magnetoresistive element 1 as the magnetoresistive element is placed with a barrier layer 21 being inserted between the highly polarized spin injection layer 31 and the giant magnetoresistive element 1. The giant magnetoresistive element 1 consists of a ferromagnetic free layer 11, a conductive non-magnetic layer 12, a ferromagnetic pinned layer 13, and an antiferromagnetic layer 14 which are laminated in order of mention with the ferromagnetic free layer 11 at the bottom. The magnetization of the ferromagnetic fee layer 11 turns freely by an external magnetic field (H) and electric resistance in a direction vertical to the plane of the layer changes, according to the angle of the turning, and magnetoresistance is generated.

On either ends of the giant magnetoresistive element 1 which is a giant magnetoresistive layer, inter-layer insulation layers 81 are formed to prevent electrical leakage between a terminal 51 and a terminal 53.

The terminal 51 is placed on the antiferromagnetic layer 14, a terminal 52 and the terminal 53 are placed on the ferromagnetic free layer 11 and a terminal 54 and a terminal 55 are placed on the highly polarized spin injection layer 31. Current flows between the terminal 51 and the terminal 54 and the resistance change rate between the terminal 51 and the terminal 53 is assumed to be the output of the giant magnetoresistive element 1.

Then, a method of fabricating the above magnetoresistive sensor and typical examples of materials of the layers will be described. On the Si substratum 60, the following are grown in sequence by RF sputtering: a film consisting of two laminates of Co (5-nm thick)/Cu (2 nm), which is the highly polarized spin injection layer 31, a 2-nm thick $Al_2O_3$ film as the barrier-layer 21, a 10-nm thick CoFe film as the ferromagnetic free layer 11, a 2.2-nm thick Cu film as the conductive non-magnetic layer 12, a 2-nm thick CoFe film as the ferromagnetic pinned layer, and a 12-nm PtMn film as the antiferromagnetic layer. Then, the layers are patterned into their predetermined shapes. The $Al_2O_3$ film is grown by natural oxidation after a 1.5-nm thick Al film is deposited. This may be grown by plasma oxidation. Then, after applying photoresist on the surface, the layers were patterned into their designed shapes by photolithography. Specific areas of the thus formed layers: the area of the ferromagnetic free layer 11 is 20 by 20 $\mu m^2$ and the area of the antiferromagnetic layer 14 is 5 by 5 $\mu m^2$. The terminal 51 is formed into a predetermined shape, the terminals 52 and 53 are formed so as to be located in place on the ferromagnetic free layer 11, and the terminals 53 and 54 are formed so as to be located in place on the highly polarized spin injection layer 31. The element is thus fabricated.

The thus fabricated three terminal magnetoresistive element was found to have a resistance change rate of 150%. The resistance change rate was obtained by allowing a sense current to flow between the terminal 51 and the terminal 55 and measuring the resistance change rate between the terminal 53 and the terminal 51. This resistance change characteristic is about five times as great as the resistance change rate (30%) of previous giant magnetoresistive elements. This is due to that a band of s electrons in the Cu film grown in the highly polarized spin injection layer is placed in a highly polarized state near the Fermi level and the upward spin current only flows into the giant magnetoresistive element 1, which has multiplied the output.

In fabricating the element, the first terminal for applying a bias voltage to the highly polarized spin injection layer, the second terminal for detecting the voltage of the magnetoresistive layer, and the third terminal which is used for both the bias voltage application and the magnetoresistive layer voltage detection were installed. In the alternative terminal arrangement, a pair of first terminals and a pair of second terminals were employed and the third terminal was dispensed with, and this produced the same advantageous effect. For further embodiments which will be described later, the same result was found even if the alternative terminal arrangement applied. In either terminal arrangement, because of having the terminals respectively functioning in three ways, the magnetoresistive element of the present invention is a three terminal element.

While the ferromagnetic free layer 11 and the ferromagnetic pinned layer 13 are made of CoFe in Embodiment 1, these layers may be made of NiFe, a CoFe and NiFe layered laminate (CoFe/NiFe), or a CoFe/Ru/CoFe layered laminate. While the barrier layer 21 is made of $Al_2O_3$ in Embodiment 1, the material of the barrier layer 21 may be MgO, $SrTiO_3$, $HfO_2$, Tao, NbO, or MoO.

The highly polarized spin injection layer may be made of what is called a half metal ferromagnetic material, such as $Sr_2FeMoO_7$, $La_{0.7}Sr_{0.3}MnO_3$, MnSb, $CrO_2$, MnAs, Co—$TiO_2$, or CrAs. Alternatively, this layer may consist of a laminate of ferromagnetic and non-magnetic layers in which the ferromagnetic layer is made of any single metal material out of Mn, Co, Ni, and Fe or a metal compound including at least one of these metals and the non-magnetic layer is made of Au, Ag, Pt, Pd, Ir, Cr, or Ru.

[Embodiment 2]

Figure 2:
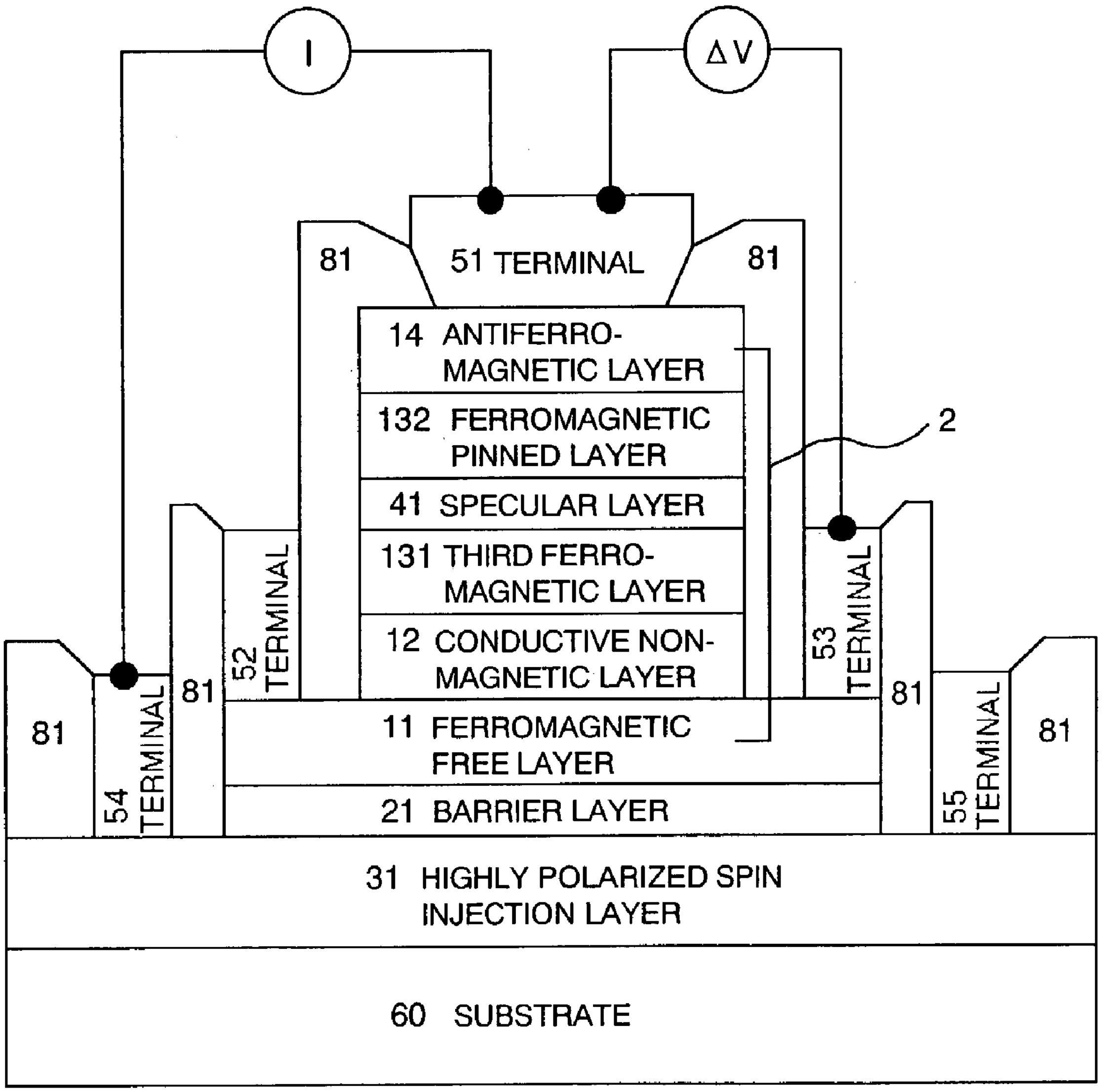
FIG. 2 is a simplified structural diagram showing a second structure example of a three terminal magnetoresistive element integral with a highly polarized spin injection layer of the present invention.

A preferred Embodiment 2 of the invention is shown in FIG. 2. A magnetoresistive structure of FIG. 2 includes a giant magnetoresistive element 1 in which a specular layer 41 is inserted in the ferromagnetic pinned layer 13 as alteration to the corresponding structure of FIG. 1. The process of fabricating the element is the same as for Embodiment 1 and the terminal arrangement and the method of measuring the resistance change rate are also the same as for Embodiment 1.

By inserting the specular layer 41, specular reflection of electrons takes place on the interfaces of this layer and an average free travel distance of the electrons becomes longer, and, consequently, the magnetoresistive element of Embodiment 2 is able to produce higher output than the magnetoresistive element of Embodiment 1.

While the specular layer 41 is made of a CoFe oxide in Embodiment 2, this layer may be made of any other oxide. A resistance change rate of 200% was measured for the three terminal magnetoresistive element of Embodiment 2.

[Embodiment 3]

Figure 3:
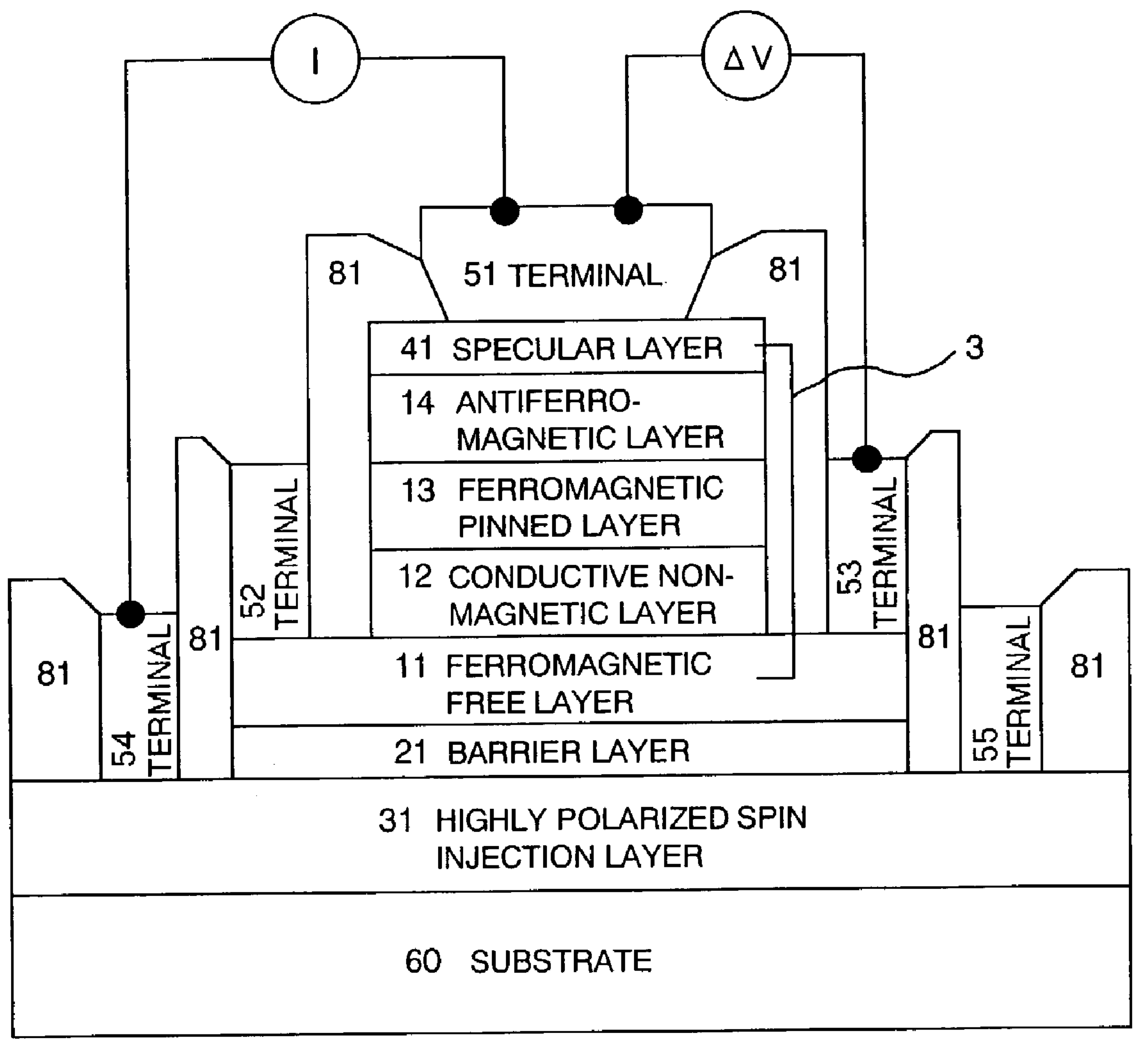
FIG. 3 is a simplified structural diagram showing a third structure example of a three terminal magnetoresistive element integral with a highly polarized spin injection layer of the present invention.

A preferred Embodiment 3 of the invention is shown in FIG. 3. A magnetoresistive structure of FIG. 3 includes a giant magnetoresistive element 3 in which the specular layer in the corresponding structure of FIG. 2 is formed on top of the antiferromagnetic layer 14. The process of fabricating the element is the same as for Embodiment 1 and the terminal arrangement and the method of measuring the resistance change rate are also the same as for Embodiment 1.

By inserting the specular layer 41, specular reflection of electrons takes place on the interfaces of this layer and an average free travel distance of the electrons becomes longer, and, consequently, the magnetoresistive element of Embodiment 3 is able to produce higher output than the magnetoresistive element of Embodiment 1. A resistance change rate of 160% was measured for the magnetoresistive element of Embodiment 3.

[Embodiment 4]

Figure 4:
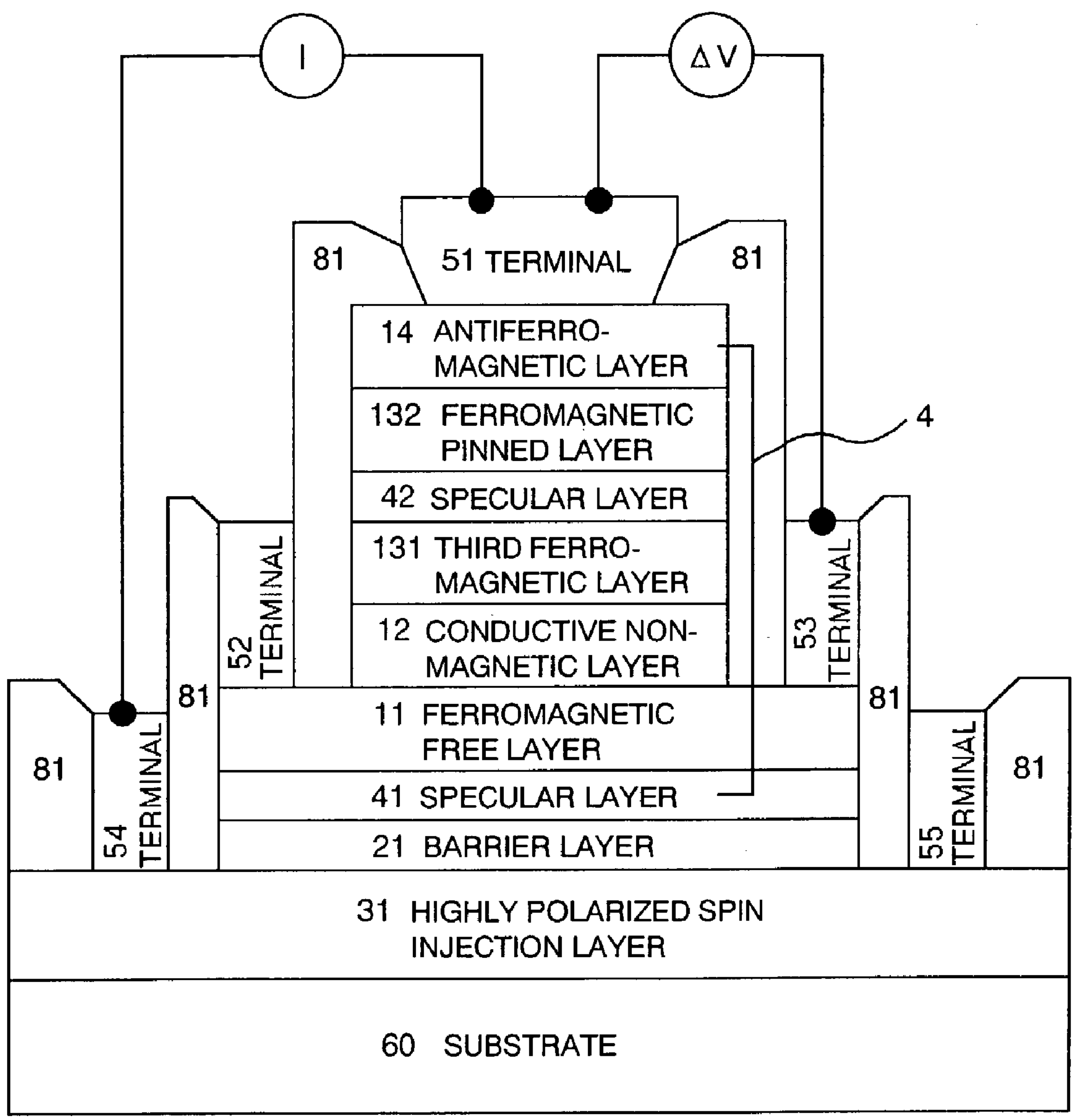
FIG. 4 is a simplified structural diagram showing a fourth structure example of a three terminal magnetoresistive element integral with a highly polarized spin injection layer of the present invention.

A preferred Embodiment 4 of the invention is shown in FIG. 4. A magnetoresistive structure of FIG. 4 includes a giant magnetoresistive element 4 in which another specular layer is inserted between the ferromagnetic free layer 11 and the barrier layer 21 in addition to the corresponding structure of FIG. 2.

The process of fabricating the element is the same as for Embodiment 1 and the terminal arrangement and the method of measuring the resistance change rate are also the same as for Embodiment 1.

In this structure, an average free travel distance of electrons between a pair of specular layers can be made further longer. The measured resistance change rate was further enhanced as compared with Embodiment 2 and reached 300%.

[Embodiment 5]

Figure 5:
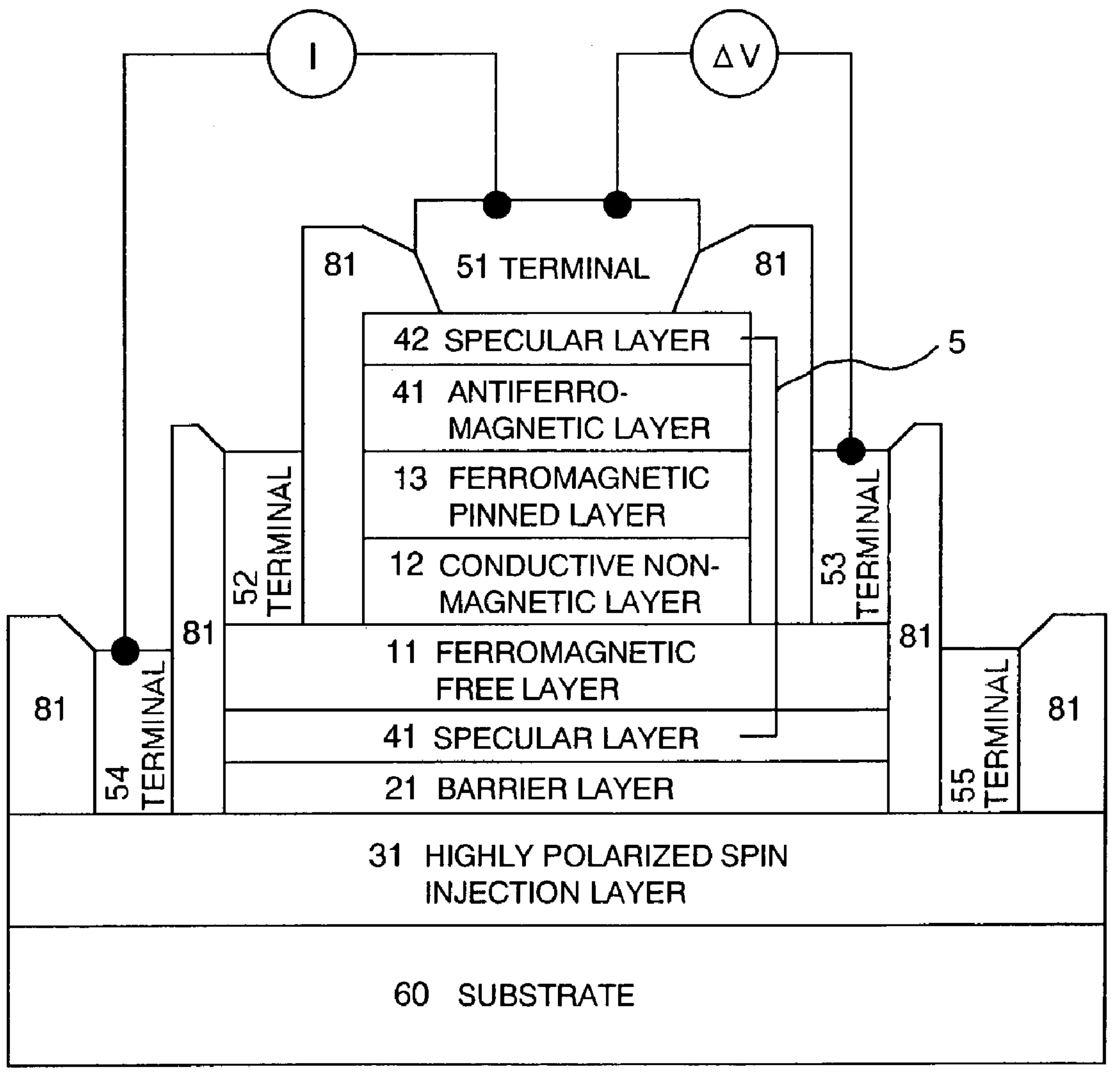
FIG. 5 is a simplified structural diagram showing a fifth structure example of a three terminal magnetoresistive element integral with a highly polarized spin injection layer of the present invention.

A preferred Embodiment 5 of the invention is shown in FIG. 5. A magnetoresistive structure of FIG. 5 includes a giant magnetoresistive element 5 in which the specular layer 42 is formed on the antiferromagnetic layer 41 as alteration to the corresponding structure of FIG. 4. The process of fabricating the element is the same as for Embodiment 1 and the terminal arrangement and the method of measuring the resistance change rate are also the same as for Embodiment 1.

A resistance change rate of 180% was measured in Embodiment 5; this enhancement is, however, smaller than achieved by the magnetoresistive structure of FIG. 4, because electrons scatter to a great extent in the antiferromagnetic layer 41.

[Embodiment 6]

Figure 6:
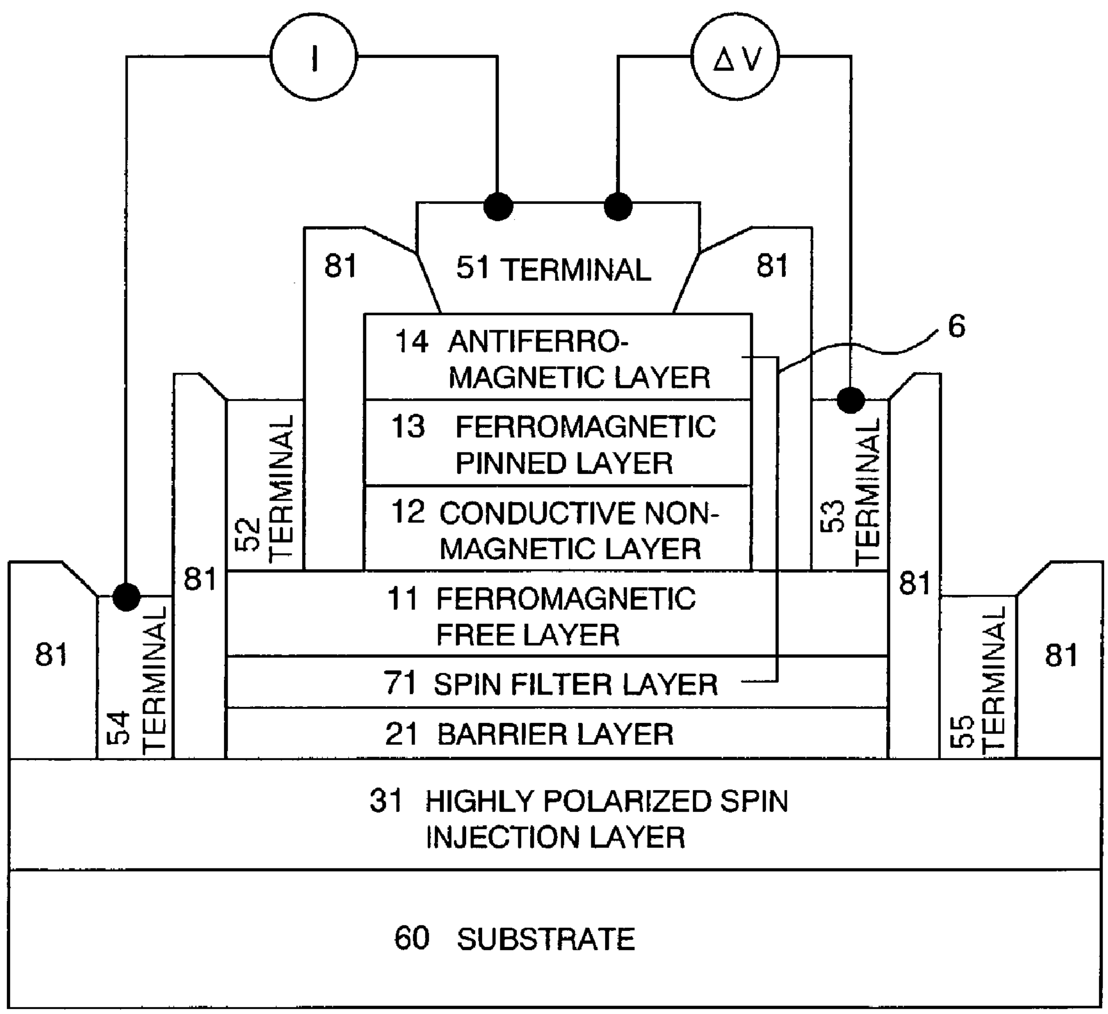
FIG. 6 is a simplified structural diagram showing a sixth structure example of a three terminal magnetoresistive element integral with a highly polarized spin injection layer of the present invention.

A preferred Embodiment 6 of the invention is shown in FIG. 6. A magnetoresistive structure of FIG. 6 includes a giant magnetoresistive element 6 in which a spin filter layer 71 is inserted under the ferromagnetic free layer 11 as alternation to the corresponding structure of FIG. 1.

The spin filter layer 71 is made of a 2-nm thick Cu film. The process of fabricating the element is the same as for Embodiment 1 and the terminal arrangement and the method of measuring the resistance change rate are also the same as for Embodiment 1. By inserting the spin filter layer 71, an average free travel distance of conductive electrons can be made longer. A resistance change rate of 170% was measured for the magnetoresistive element of Embodiment 6.

[Embodiment 7]

Figure 7:
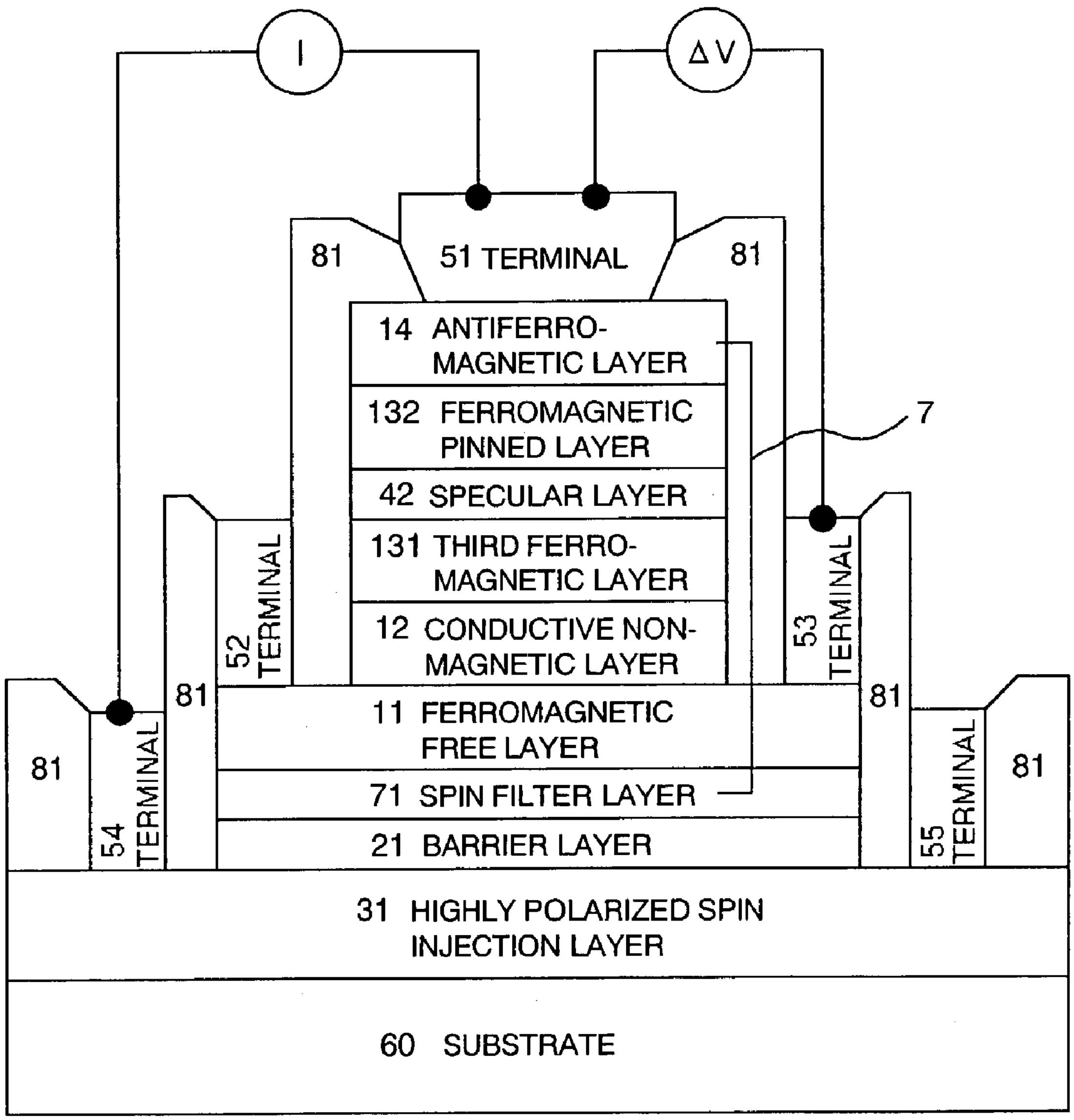
FIG. 7 is a simplified structural diagram showing a seventh structure example of a three terminal magnetoresistive element integral with a highly polarized spin injection layer of the present invention.

A preferred Embodiment 7 of the invention is shown in FIG. 7. A magnetoresistive structure of FIG. 7 includes a giant magnetoresistive element 7 in which a spin filter layer 71 is inserted under the ferromagnetic free layer 11 as alternation to the corresponding structure of FIG. 2.

The spin filter layer 71 is made of a 2-nm thick Cu film as in Embodiment 6. In this structure, by virtue of both the spin filter layer 71 and the specular layer 42, an average free travel distance of electrons can be made still longer than obtained in Embodiment 6.

The process of fabricating the element is the same as for Embodiment 1 and the terminal arrangement and the method of measuring the resistance change rate are also the same as for Embodiment 1. A resistance change rate of 200% was measured for the magnetoresistive element of Embodiment 7.

[Embodiment 8]

Figure 8:
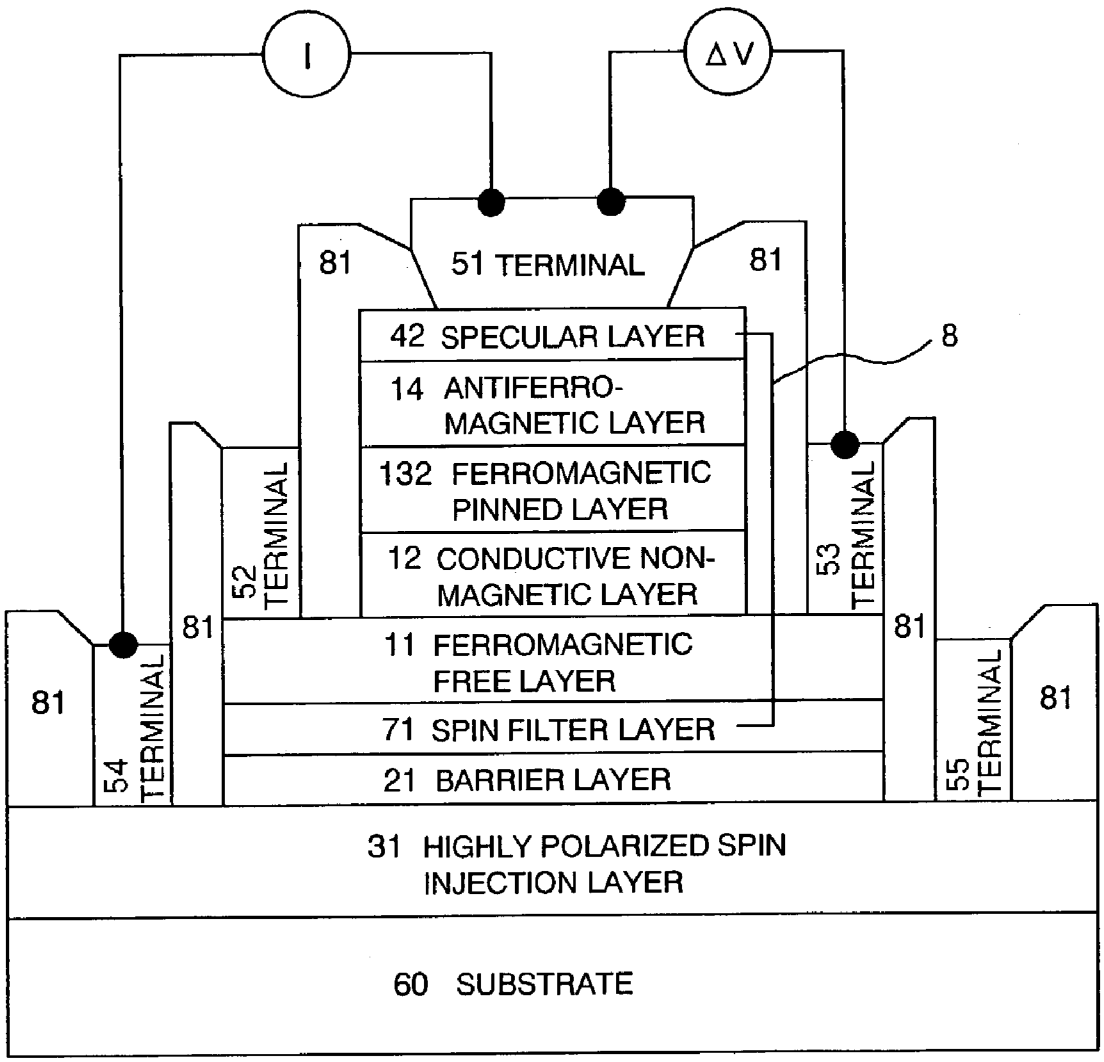
FIG. 8 is a simplified structural diagram showing an eighth structure example of a three terminal magnetoresistive element integral with a highly polarized spin injection layer of the present invention.

A preferred Embodiment 8 of the invention is shown in FIG. 8. A magnetoresistive structure of FIG. 8 includes a giant magnetoresistive element 8 in which a spin filter layer 71 is inserted under the ferromagnetic free layer 11 as alternation to the corresponding structure of FIG. 3. The spin filter layer 71 is made of a 2-nm thick Cu film as in Embodiments 6 and 7. The process of fabricating the element is the same as for Embodiment 1 and the terminal arrangement and the method of measuring the resistance change rate are also the same as for Embodiment 1.

In this structure, by inserting the spin filter layer 71, an average free travel distance of electrons can be made still longer than obtained in Embodiment 3. A resistance change rate of 170% was measured for the magnetoresistive element of Embodiment 8.

[Embodiment 9]

Figure 9:
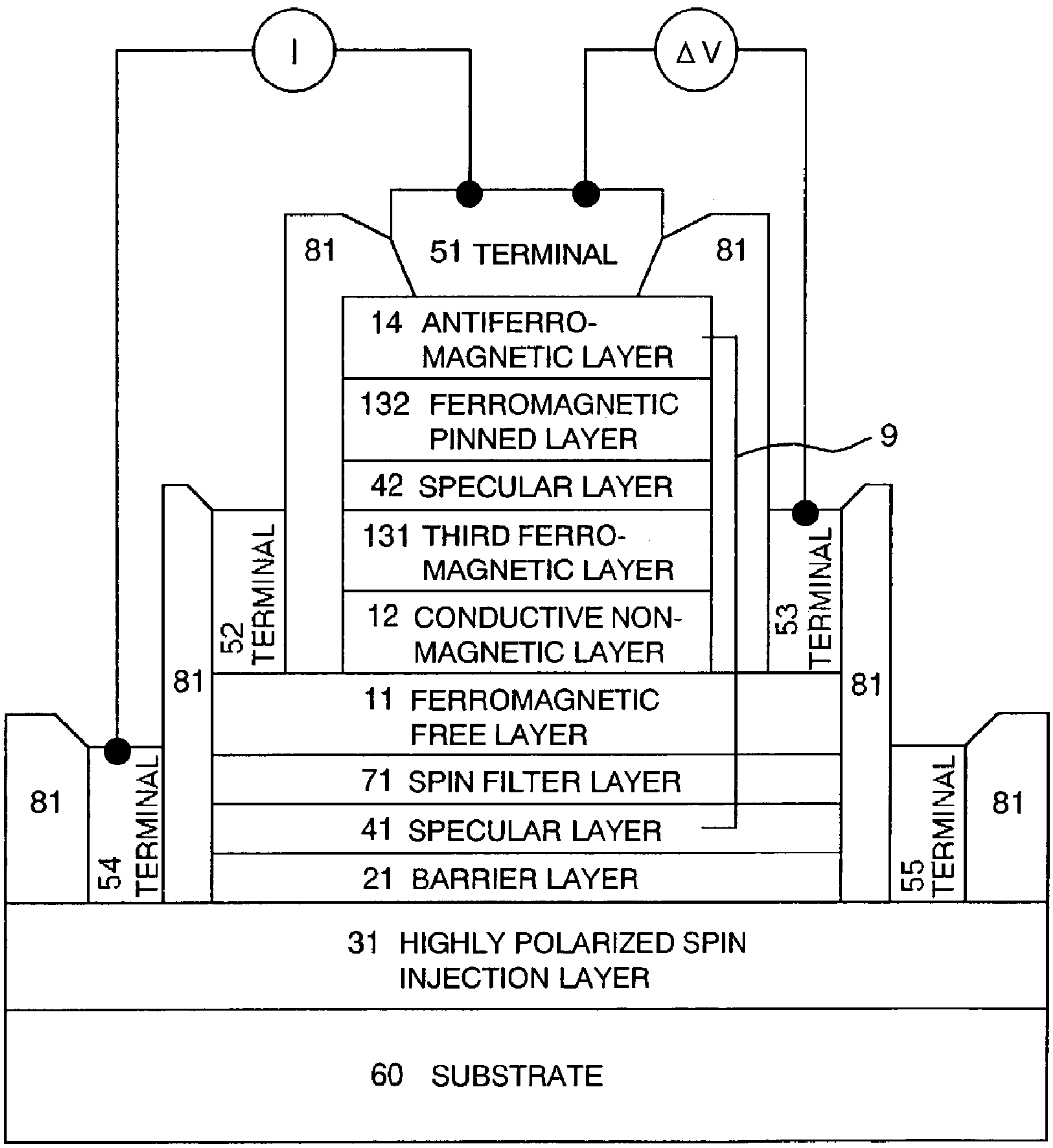
FIG. 9 is a simplified structural diagram showing a ninth structure example of a three terminal magnetoresistive element integral with a highly polarized spin injection layer of the present invention.

A preferred Embodiment 9 of the invention is shown in FIG. 9. A magnetoresistive structure of FIG. 9 includes a giant magnetoresistive element 9 in which a spin filter layer 71 is inserted between the ferromagnetic free layer 11 and the specular layer 41 as alternation to the corresponding structure of FIG. 4. The spin filter layer 71 is made of a 2-nm thick Cu film as in Embodiments 6, 7, and 8. The process of fabricating the element is the same as for Embodiment 1 and the terminal arrangement and the method of measuring the resistance change rate are also the same as for Embodiment 1.

In this structure, by inserting the spin filter layer 71, an average free travel distance of electrons can be made still longer, and, moreover, electrons can be trapped between the pair of the specular layers 41 and 42. Therefore, a still greater resistance change rate can be obtained. A resistance change rate of 1000% was measured for the magnetoresistive element of Embodiment 9.

[Embodiment 10]

Figure 10:
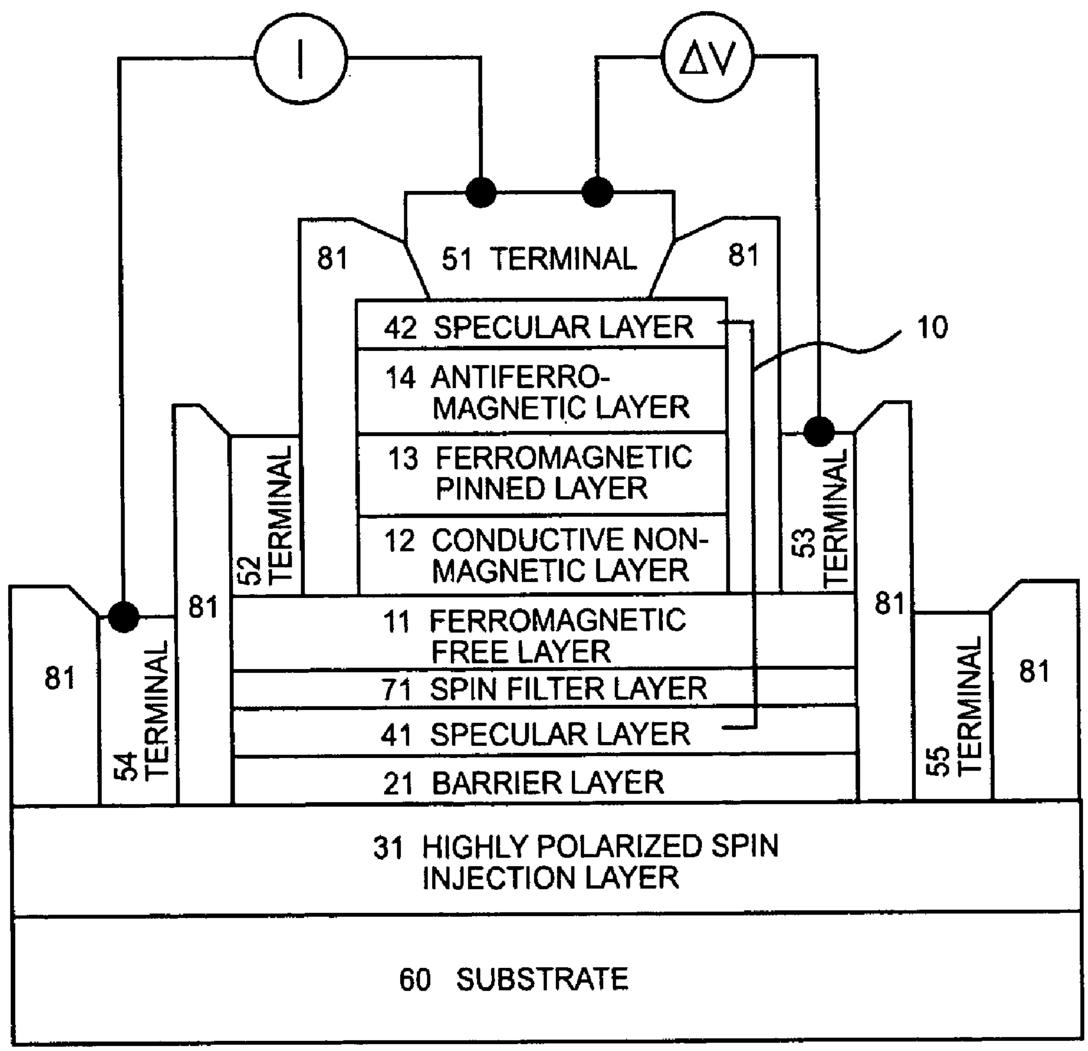
FIG. 10 is a simplified structural diagram showing a tenth structure example of a three terminal magnetoresistive element integral with a highly polarized spin injection layer of the present invention.

A preferred Embodiment 10 of the invention is shown in FIG. 10. A magnetoresistive structure of FIG. 10 includes a giant magnetoresistive element 10 in which a spin filter layer 71 is inserted between the ferromagnetic free layer 11 and the specular layer 41 as alternation to the corresponding structure of FIG. 5. The spin filter layer 71 is made of a 2-nm thick Cu film as in Embodiments 6, 7, and 8. The process of fabricating the element is the same as for Embodiment 1 and the terminal arrangement and the method of measuring the resistance change rate are also the same as for Embodiment 1.

In this structure, by inserting the spin filter layer 71, an average free travel distance of electrons can be made still longer, and, moreover, electrons can be trapped between the pair of the specular layers 41 and 42. Therefore, a greater resistance change rate can be obtained. A resistance change rate of 200% was measured for the magnetoresistive element of Embodiment 10.

[Embodiment 11]

Figure 11:
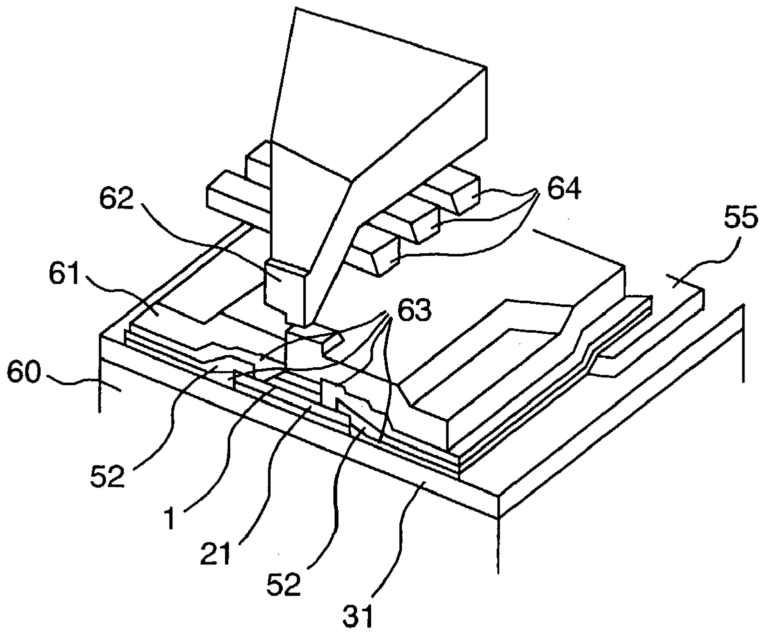
FIG. 11 is a schematic, perspective illustration of an example of a recording/reading head using a three terminal magnetoresistive element integral with a highly polarized spin injection layer of the present invention.

FIG. 11 is a schematic showing an example of a magnetic head having a magnetic sensor constituted by a three terminal magnetoresistive element of the present invention. The magnetic head is fabricated on a substratum 60 and comprised of a highly polarized spin injection layer 31, a barrier layer 21, a giant magnetoresistive element 1, terminals 52 made of Au, a lower shield 61 made of a 100-nm thick NiFe film, upper shield and lower core 61 made of a 1-$\mu$m thick NiFe film, inter-layer insulative protection films 63, coils 64, and an upper core 62 made of CoNiFe.

Figure 12:
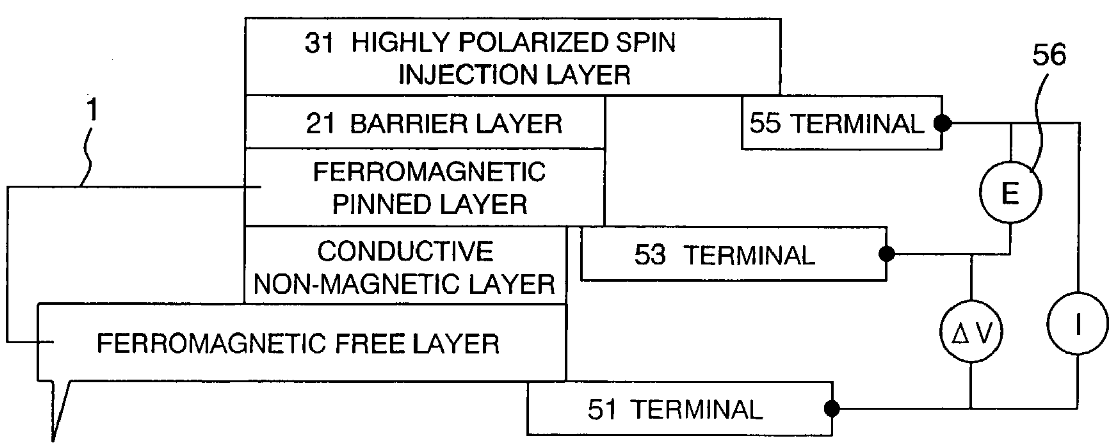
FIG. 12 is a simplified, cross sectional view of an example of a recording/reading head using a three terminal magnetoresistive element integral with a highly polarized spin injection layer of the present invention.

FIG. 12 represents an example of a magnetic head having a three terminal magnetoresistive element of the present invention. The ferromagnetic free layer of the giant magnetoresistive element 1 also functions as a probe-type recording head for writing data onto a magnetic recording medium. Terminals 51 and 53 are located so that they can detect output between the ferromagnetic free layer and the ferromagnetic pinned layer of the giant magnetoresistive element 1. The giant magnetoresistive element 1 and the highly polarized spin injection layer 31 were formed in place with the barrier layer 21 inserted therebetween. A terminal 55 contacts with the highly polarized spin injection layer 31. As for the giant magnetoresistive element 1, any of the above-described giant magnetoresistive elements 2, 3, 4, 5, 6, 7, 8, 9, and 10 may be used. If one of these giant magnetoresistive element is used, the output of the magnetic head can be enhanced in proportion to the enhanced resistance change rate of the used magnetoresistive element.

The output is detected as follows: allow a sense current to flow between the terminals 51 and 55 and detect change in resistance between the terminals 53 and 51. A signal to be detected may be either voltage output or current output. A power supply of current/voltage 56 is provided for enabling voltage application between the terminals 53 and 55. From the power supply 56, by applying a suitable voltage between 0 and 1 V, the output of the giant magnetoresistive element 1 can be maximized. The power supply 56 is integrated in the magnetic recording apparatus using the magnetic head.

For a head using a TMR element disclosed in Publication 2001-202604 mentioned in the "Description of the Related Art" section, its problem is that resistance must be reduced because the TMR element is used. On the other hand, the magnetic head of the present invention uses a giant magnetoresistive element and, therefore, its relative resistance change rate can be multiplied, as noted in the foregoing Embodiments, with the resistance of the head which is a conventional type keeping at about 20 Ω. Consequently, magnetic heads that perform well for magnetic recording media of 500 Gb/in$^2$ or higher recording density can be realized.

[Embodiment 12]

Figure 20:
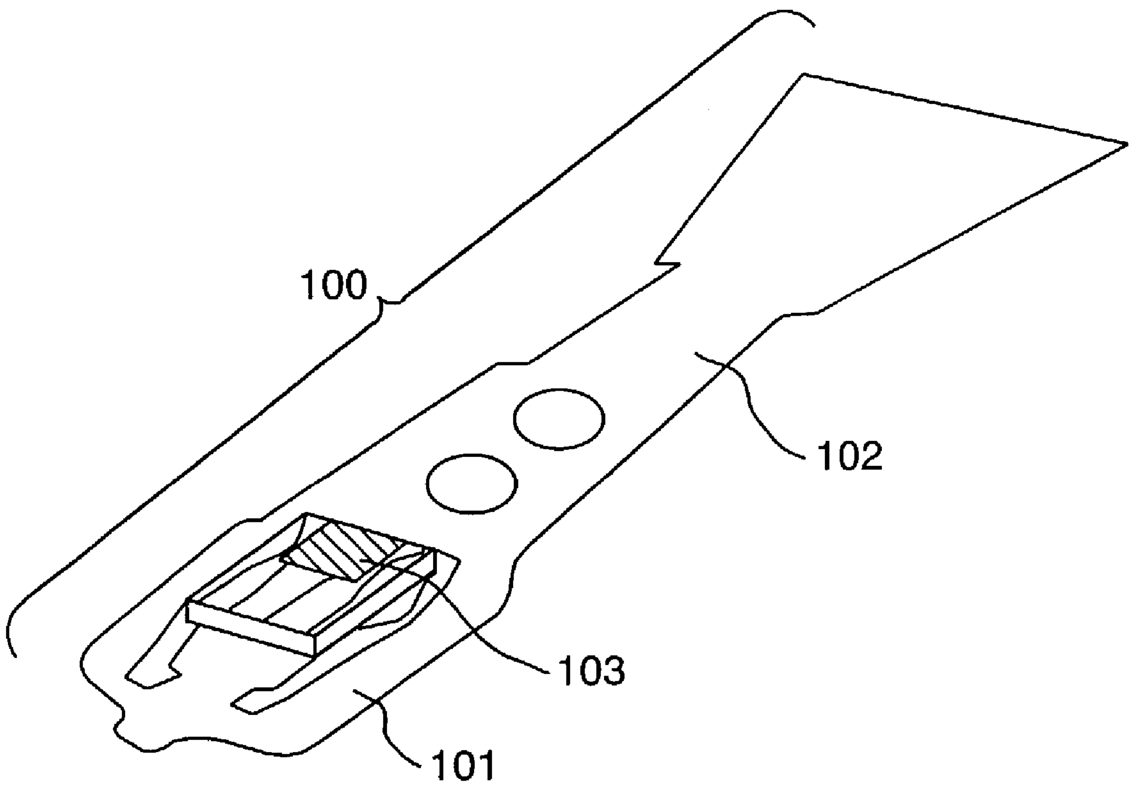
FIG. 20 is a schematic showing an invented magnetic head gimbal assembly including an IC chip.
Figure 21:
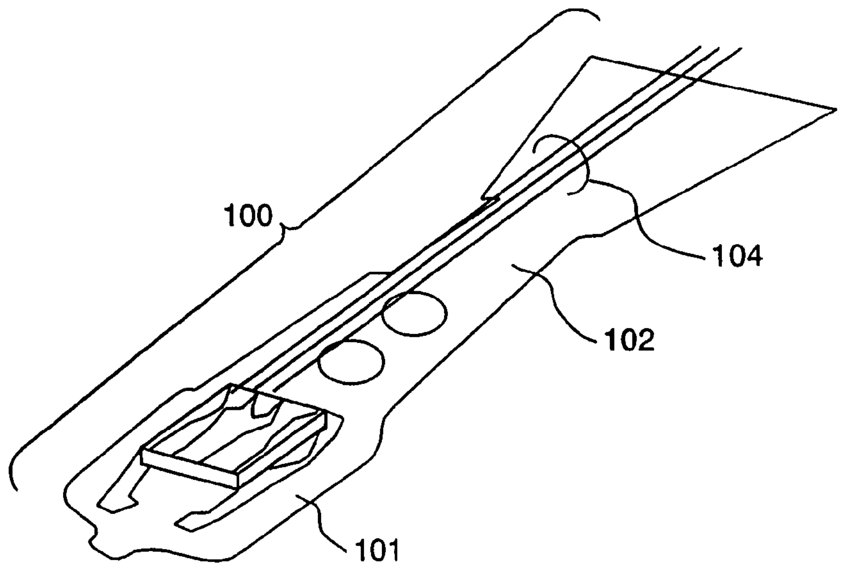
FIG. 21 is a schematic showing an invented magnetic head gimbal assembly having surface-mounted leads.

FIGS. 20 and 21 are schematics showing two types of magnetic head gimbal assemblies of the present invention. Reference numeral 101 denotes a suspension and 102 denotes a gimbal. For both types, the gimbal supports a slider on which the above-described magnetic head of the present invention is mounted. FIG. 20 shows a gimbal type including an IC chip, wherein the power supply and detection circuits required for detecting the output of the three terminal magnetoresistive element of the present invention are provided on the IC chip.

FIGS. 20 and 21 are schematics showing two types of magnetic head gimbal assemblies of the present invention. Reference numeral 101 denotes a suspension and 102 denotes a gimbal. For both types, the gimbal supports a slider on which the above-described magnetic head of the present invention is mounted. FIG. 20 shows a gimbal type including an IC chip 103 wherein the power supply and detection circuits required for detecting the output of the three terminal magnetoresistive element of the present invention are provided on the IC chip.

FIG. 21 shows a gimbal type having surface-mounted leads 104 wherein the leads from the three terminal magnetoresistive element of the present invention are connected to the power supply and detection circuits in the magnetic recording and reproducing apparatus using the magnetic head gimbal assembly. The terminals from which the leads of the three terminal magnetoresistive element run and the terminals which function as electrodes are arranged, for example, as shown in FIG. 12.

In FIG. 12, the terminals 51 and 53 are for detecting output signals of the giant magnetoresistive element 1. The terminals 52 and 53 contact with the ferromagnetic free layer 11. The terminal 54 and terminal 51, which contact with the highly polarized spin injection layer 31, form a closed circuit for injecting highly spin-polarized electrons into the giant magnetoresistive element 1 from the highly polarized spin injection layer. The terminals 52 and 55 are for applying a bias between the highly polarized spin injection layer 31 and the ferromagnetic free layer 11. The terminal 52 contacts with the ferromagnetic free layer 11 and the terminal 55 contacts with the highly polarized spin injection layer 31. In this terminal arrangement, highly spin-polarized electrons can be injected efficiently. The terminals of the three terminal magnetoresistive element may be arranged more simply such that a terminal functions as both the terminals 52 and 53 and a terminal functions as both the electrodes 55 and 54.

[Embodiment 13]

Figure 13:
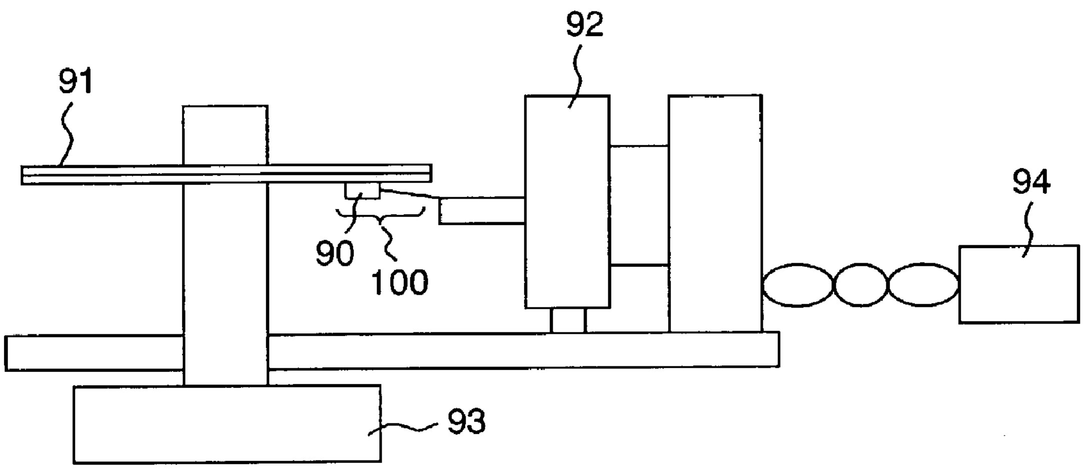
FIG. 13 is a schematic showing a simplified structure example of a magnetic recording apparatus including a recording/reading head using a three terminal magnetoresistive element integral with a highly polarized spin injection layer of the present invention.

FIG. 13 is a schematic showing a simplified structure example of a magnetic recording and reproducing apparatus of the preset invention. A recording medium 91 on which data is magnetically recorded is rotated by a spindle motor 93 and a head slider 90 having a magnetic head, which is supported on a magnetic head gimbal assembly 100, is moved on the tracks of the recording medium 91 by an actuator 92. Specifically, in the magnetic disk drive, the reading head and recording head formed on the head slider 90 approach a certain record position on the recording medium by this mechanism and sequentially write or read signals in relative motion.

As the actuator 92, a rotary actuator is preferable. Signals to be recorded are supplied from a signal processing unit 94 and recorded on the medium by the recording head and the output of the reading head is supplied to the signal processing unit 94 from which signals are generated. When moving the reading head to a target record track, the drive detects the head position on a track, using highly sensitive output from the reading head, so the drive can move the head slider to the target track position by controlling the actuator.

While a single slider 90 and a single recording medium 91 are shown in FIG. 13, a plurality of sliders and a plurality of media may be used. As the recording medium 91, a double-sided recording medium may be used for data recording. If a double-sided recording medium is used, two sliders 90 should be provided for both sides of the medium, respectively. The magnetic recording and reproducing apparatus was produced, which used a magnetic head including a giant magnetoresistive element integral with the above-mentioned highly polarized spin injection layer 31 as the reading element. As the reading element of the magnetic head, any of the above-described giant magnetoresistive elements 2, 3, 4, 5, 6, 7, 8, 9, and 10 may be used. The magnetic recording and reproducing apparatus featuring the invented magnetoresistive element exhibited better characteristics of performance in higher density recording and realized 500 $Gb/in^2$ or higher recording density, as compared with the corresponding apparatus using a magnetic head fabricated with a reading element structure of prior art.

[Embodiment 14]

Figure 14:
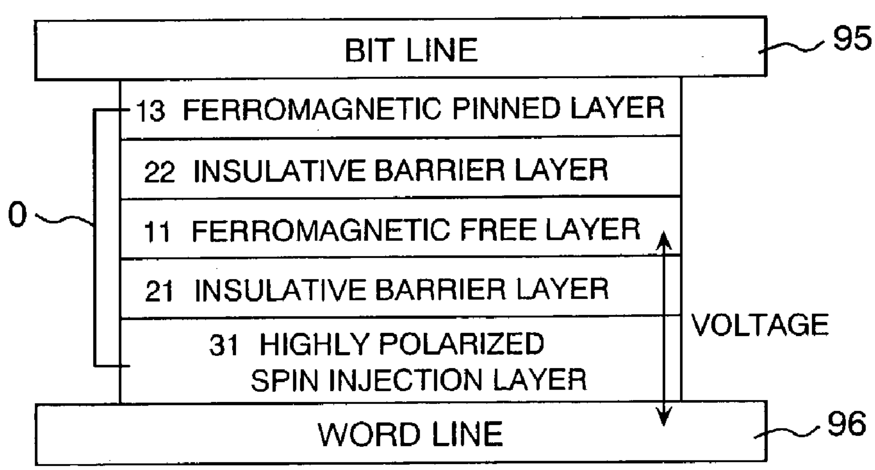
FIG. 14 is a simplified, cross sectional view of an example of a magnetic memory cell using a three terminal magnetoresistive element integral with a highly polarized spin injection layer of the present invention.

FIG. 14 shows an example of a random access magnetic memory device featuring a three terminal magnetoresistive element 0 of the present invention. A giant magnetoresistive element and a highly polarized spin injection layer 31 are formed in place with an insulating barrier layer 21 inserted therebetween. A bit line 95 and a word line 96 run in contact with the three terminal magnetoresistive element.

Figure 15:
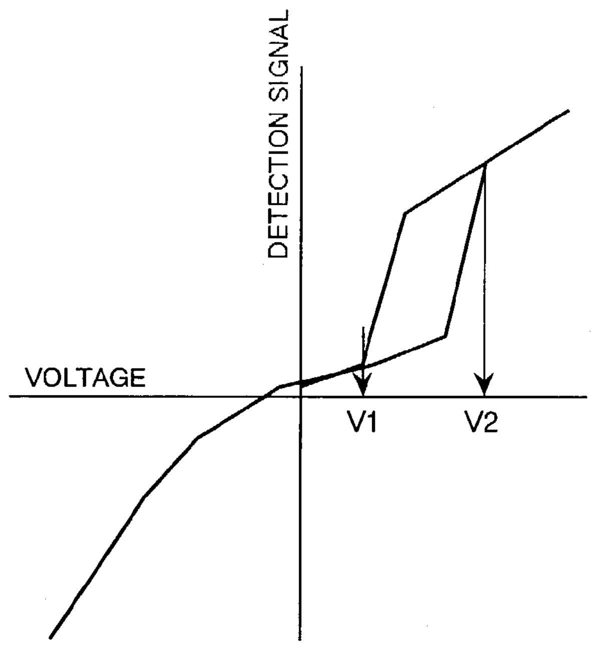
FIG. 15 is a graph showing an example of characteristics of detected signal versus voltage of a magnetic memory cell using a three terminal magnetoresistive element integral with a highly polarized spin injection layer of the present invention.

FIG. 15 is a graph showing voltage V versus detected signal characteristics of the three terminal magnetoresistive element 0 of the present invention. Voltage V is voltage applied between the highly polarized spin injection layer 31 and the ferromagnetic free layer 11. Between voltage V1 and voltage V2, the direction of magnetization of the ferromagnetic free layer 11 is reversed. By setting the voltage below V1 or above V2, the direction of magnetization of the ferromagnetic free layer 11 is fixed. A voltage of (V1+V2)/2 is sensed as a detected signal and a record bit state is read.

[Embodiment 15]

Figure 16:
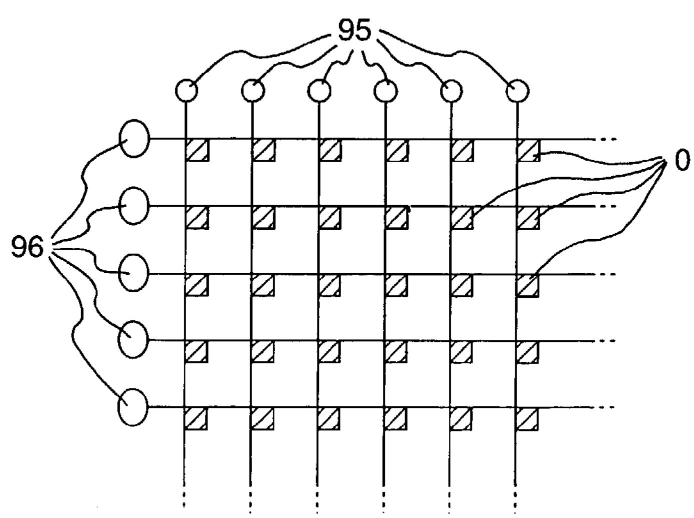
FIG. 16 is a simplified top plan view of an example of integrated circuitry of magnetic memory cells, each using a three terminal magnetoresistive element integral with a highly polarized spin injection layer of the present invention.

FIG. 16 shows an example of integrated circuitry in which the three terminal magnetoresistive element 0 shown in FIG. 14 is installed in each cell. The three terminal magnetoresistive elements 0 are installed in places where a bit line 95 and a word line 96 intersect. A bit line and a word line which intersect at a target cell are selected and data is read and written.

[Embodiment 16]

Figure 17:
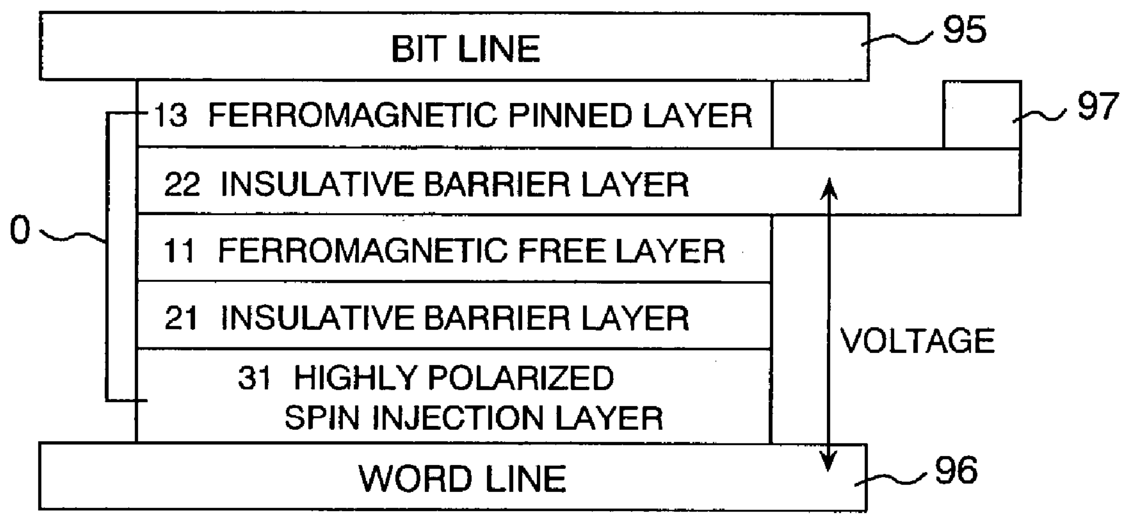
FIG. 17 is a simplified, cross sectional view of another example of a magnetic memory cell using a three terminal magnetoresistive element integral with a highly polarized spin injection layer of the present invention.

FIG. 17 shows another example of a magnetic memory device which has the same structure as the three terminal magnetoresistive element 0 shown in FIG. 14, but a terminal 97 that enables voltage application to the ferromagnetic free layer 11 is added. A giant magnetoresistive element and a highly polarized spin injection layer 31 are formed in place with an insulating barrier layer 21 inserted therebetween. A bit line 95 and a word line 96 run in contact with the three terminal magnetoresistive element.

Figure 18:
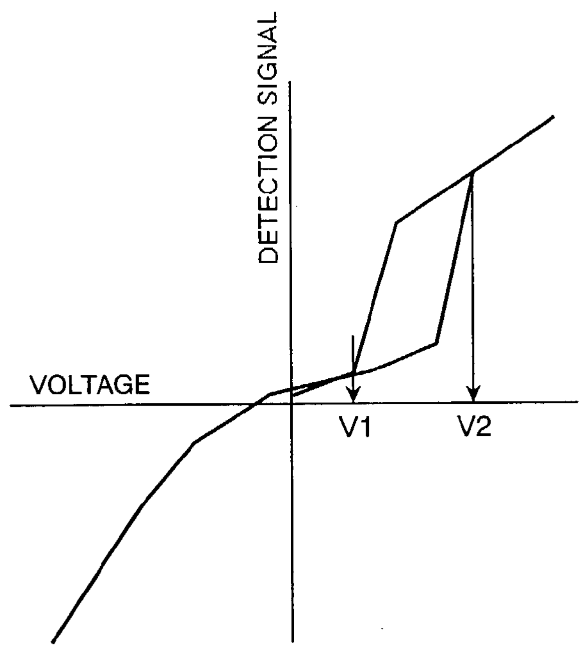
FIG. 18 is a graph showing another example of characteristics of detected signal versus voltage of a magnetic memory cell using a three terminal magnetoresistive element integral with a highly polarized spin injection layer of the present invention.

FIG. 18 is a graph showing voltage V versus detected signal characteristics of the three terminal magnetoresistive element 0 of FIG. 17. Voltage V is voltage applied between the highly polarized spin injection layer 31 and the ferromagnetic free layer 11, using the terminal 97. Between voltage V1 and voltage V2, the direction of magnetization of the ferromagnetic free layer 11 is reversed. By setting the voltage below V1 or above V2, the direction of magnetization of the ferromagnetic free layer 11 is fixed. A voltage of (V1+V2)/2 is sensed as a detected signal and a record bit state is read.

[Embodiment 17]

Figure 19:
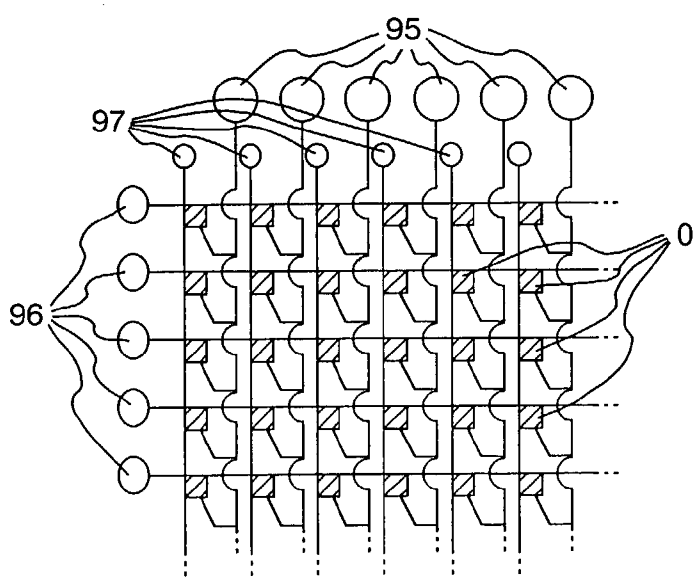
FIG. 19 is a simplified top plan view of another example of integrated circuitry of magnetic memory cells, each using a three terminal magnetoresistive element integral with a highly polarized spin injection layer of the present invention.

FIG. 19 shows another example of integrated circuitry in which the three terminal magnetoresistive element 0 shown in FIG. 17 is installed in each cell. The three terminal magnetoresistive elements 0 are installed in places where a bit line 95 and a word line 96 intersect. Terminals 97 are provided to enable voltage application to the ferromagnetic free layer 11 of each of the three terminal magnetoresistive elements 0. To read and write data from/to a target cell are performed by applying current/voltage to the bit line and word line that intersect at the cell and the terminal 97 connected to the cell.

Figure 22:
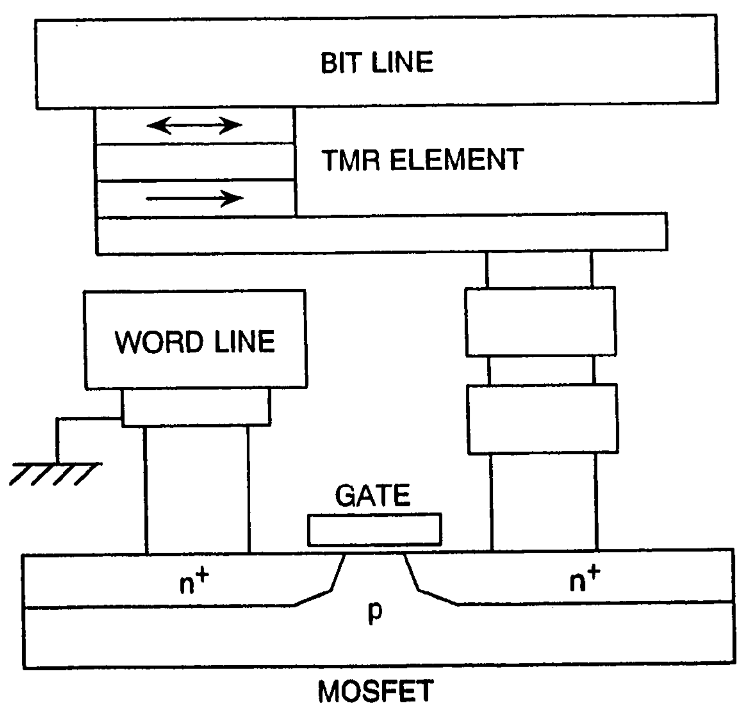
FIG. 22 is a diagram showing a simplified structure of a conventional random access magnetic memory device.

FIG. 22 shows an example of a conventional random access magnetic memory device. In this conventional memory device example in which the magnetization direction of the magnetoresistive element is reversed by using a magnetic field produced by the current flowing through a bit line and a word line, complex wiring made high-density integration difficult. In contrast, for random access magnetic memory devices of the present invention, as shown in the foregoing embodiment example, wiring is simple and highly dense integration of these devices can easily be implemented.

By fabricating a magnetic head with a three terminal magnetoresistive element which is integral with means for injecting highly spin-polarized electrons as described above and constructing a magnetic recording apparatus with a magnetic head gimbal assembly which supports the magnetic head, magnetic recording apparatus enabling higher density recording than before can be provided. By constructing a magnetic memory device with the above element, the direction of magnetization can be reversed without using a magnetic field produced by current flowing across the device and, consequently, memory cell area can be reduced and large capacity integration of memory cells can easily be performed.

What is claimed is:

1. A magnetic head, comprising: a layered structure including a magnetoresistive element, a current generating means for generating spin-polarized current by bias voltage application, a first terminal for applying a bias voltage to said current generating means, a second terminal for detecting voltage of only said magnetoresistive element, and a third terminal which is used for both the bias voltage application and the voltage detection of the magnetoresistive element.

2. A magnetic head according to claim 1, wherein said magnetoresistive element is a giant magnetoresistive element.

3. A magnetic head, comprising: a highly polarized spin injection layer, a magnetoresistive layer, a barrier layer inserted between said highly polarized spin injection layer and said magnetoresistive layer, a first terminal layer for applying a biasing voltage being formed on at least one end of said highly polarized spin injection layer, a second terminal layer for detecting voltage being formed on at least one end of said magnetoresistive layer, and a third terminal layer formed on said magnetoresistive layer surface opposite to its other surface contacting said barrier layer.

4. A magnetic head according to claim 3, wherein said magnetoresistive layer is a giant magnetoresistive layered structure.

5. A magnetic head according to claim 3, further comprising a first specular layer inserted between said magnetoresistive layer and said barrier layer.

6. A magnetic head according to claim 5, further comprising a second specular layer inserted between said magnetoresistive layer and said third terminal layer.

7. A magnetic head according to claim 6, wherein said first and second specular layers are made of at least any oxide out of Ni, Co, Fe, Ru, and Ta.

8. A magnetic head according to claim 3, wherein said highly polarized spin injection layer consists of a laminate of ferromagnetic and non-magnetic layers.

9. A magnetic head according to claim 3, wherein material of a laminate which is used for said highly polarized spin injection layer includes at least one of the following: Co, Fe, Ni, Mn, Al, Ti, Cu, Au, Ag, Pt, Pd, Ru, Ir, and Cr.

10. A magnetic head according to claim 3, further comprising a spin filter layer inserted between said magnetoresistive layer and said barrier layer.

11. A magnetic head according to claim 10, wherein said spin filter layer is made of any of the following: Cu, Ag, and Au.

12. A magnetic head according to claim 3, further comprising insulation layers to isolate said first, second, and third terminal layers.

13. A magnetic head according to claim 3, further comprising a first specular layer and a second specular layer, wherein said first and second specular layers are made of at least any oxide out of Ni, Co, Fe, Ru, and Ta.

14. A magnetic head, comprising: a layered structure including a magnetoresistive element, a current generating means for generating spin-polarized current by bias voltage application, a pair of first terminals for applying a bias voltage to said current generating means, and a pair of second terminals for detecting voltage of only said magnetoresistive element.

15. A magnetic head according to claim 14, wherein said magnetoresistive element is a giant magnetoresistive element.

16. A magnetic head according to claim 15, wherein the layered structure of said giant magnetoresistive element includes a first specular layer made of at least any oxide out of Ni, Co, Fe, Ru, and Ta.

17. A magnetic head according to claim 16, wherein the layered structure of said giant magnetoresistive element further includes a second specular layer made of at least any oxide out of Ni, Co, Fe, Ru, and Ta.

* * * * *

UNITED STATES PATENT AND TRADEMARK OFFICE

CERTIFICATE OF CORRECTION

PATENT NO. : 7,016,161 B2
DATED : March 21, 2006
INVENTOR(S) : Jun Hayakawa

It is certified that error appears in the above-identified patent and that said Letters Patent is hereby corrected as shown below:

Title page,
Item [54], Title, delete "MAGNETIC HEAD, MAGNETIC HEAD GIMBAL ASSEMBLY, MAGNETIC RECORDING AND REPRODUCING APPARATUS, AND MAGNETIC MEMORY" and insert -- A MAGNETIC HEAD HAVING A MAGNETORESISTIVE ELEMENT AND HIGHLY POLARIZED SPIN INJECTION LAYER --.

Signed and Sealed this

Thirtieth Day of May, 2006

JON W. DUDAS
*Director of the United States Patent and Trademark Office*